United States Patent
Hasegawa et al.

(10) Patent No.: US 8,451,006 B2
(45) Date of Patent: May 28, 2013

(54) FUEL CELL SYSTEM

(75) Inventors: Takahiko Hasegawa, Toyota (JP); Kota Manabe, Toyota (JP)

(73) Assignee: Toyota Jidosha Kabushiki Kaisha, Toyota-shi (JP)

(*) Notice: Subject to any disclaimer, the term of this patent is extended or adjusted under 35 U.S.C. 154(b) by 724 days.

(21) Appl. No.: 12/597,245

(22) PCT Filed: May 27, 2008

(86) PCT No.: PCT/JP2008/060111
§ 371 (c)(1),
(2), (4) Date: Oct. 23, 2009

(87) PCT Pub. No.: WO2008/149830
PCT Pub. Date: Dec. 11, 2008

(65) Prior Publication Data
US 2010/0127710 A1    May 27, 2010

(30) Foreign Application Priority Data
May 31, 2007  (JP) ................ 2007-144720

(51) Int. Cl.
*G01N 27/416*  (2006.01)
*H01M 10/44*  (2006.01)

(52) U.S. Cl.
USPC ............ 324/430; 320/101; 320/162

(58) Field of Classification Search
USPC ........ 324/430, 433; 320/101, 103, 134, 320/162
See application file for complete search history.

(56) References Cited

U.S. PATENT DOCUMENTS
6,573,682 B1 * 6/2003 Pearson ............ 320/101
2006/0074574 A1 * 4/2006 Gasda et al. ........ 702/63

FOREIGN PATENT DOCUMENTS

| JP | 8-22834 A | 1/1996 |
|---|---|---|
| JP | 2001317400 A | * 11/2001 |
| JP | 2002-367650 A | 12/2002 |
| JP | 2003-86220 A | 3/2003 |
| JP | 2003-297408 A | 10/2003 |
| JP | 2005-071626 A | 3/2005 |
| JP | 2005-209635 A | 8/2005 |
| JP | 2005-332702 A | 12/2005 |
| WO | WO 2006/095606 A1 | 9/2006 |
| WO | WO 2007/004702 A1 | 1/2007 |
| WO | WO 2007/004717 A1 | 1/2007 |
| WO | WO 2007/004718 A1 | 1/2007 |
| WO | WO 2007/004732 A1 | 1/2007 |
| WO | WO 2008/032537 A1 | 3/2008 |

OTHER PUBLICATIONS

Cell application handbook, 2005, second edition, p. 164 and partial English translation.

* cited by examiner

*Primary Examiner* — Edward Tso
*Assistant Examiner* — Aaron Piggush
(74) *Attorney, Agent, or Firm* — Kenyon & Kenyon LLP

(57) ABSTRACT

A fuel cell system is configured to have: a voltage superimposing unit that superimposes a predetermined AC signal on an output voltage of a fuel cell; a unit that detects an output voltage value of a battery device, the output voltage value varying as the fuel cell output voltage value on which the AC signal has been superimposed varies; a battery device voltage comparison unit that compares the detected battery device output voltage value with a predetermined threshold voltage; and a measurement permission determination unit that determines whether the AC impedance measurement is permitted or not based on whether or not the battery device output voltage value exceeds the threshold voltage. The fuel cell system can protect the battery device in the impedance measurement of the fuel cell based on an AC impedance method.

5 Claims, 5 Drawing Sheets

(a)

SUPERIMPOSE SIN-WAVE ON FC VOLTAGE COMMAND (b)

VARIATION OF FC OUTPUT VOLTAGE BY SIN-WAVE (c)

VARIATION OF CHARGE/DISCHARGE AMOUNT OF BATTERY DEVICE (d)

CASE WHERE COMPONENT DESTRUCTION IS CAUSED TO BATTERY DEVICE $V_{min}$ : VOLTAGE VALUE CAUSING COMPONENT DESTRUCTION TO BATTERY DEVICE

FUEL CELL SYSTEM

This is a 371 national phase application of PCT/JP2008/060111 filed 27 May 2008, which claims priority to Japanese Patent Application No. 2007-144720 filed 31 May 2007, the contents of which are incorporated herein by reference.

TECHNICAL FIELD

The present invention relates to a fuel cell system having a fuel cell, and particularly to a fuel cell system with an improved method for measuring the impedance of a fuel cell.

BACKGROUND ART

In a fuel cell system having a fuel cell that produces power through the electrochemical reaction between hydrogen and oxygen (air) for use as a drive source of a mobile object, such as a vehicle or a ship, if it is in a cold state at a temperature of 0° C. or lower, water present near the electrodes freezes, and could inhibit diffusion of reactant gas or reduce the electric conductivity of an electrolyte membrane. More specifically, if a fuel cell is activated in a cold environment at a temperature of 0° C. or lower, freezing could cause clogging of a reactant gas flow path and inhibit reactant gas (hydrogen and air) from flowing and reaching an electrolyte membrane, and consequently, the electrochemical reaction would not proceed even if the fuel cell is supplied with fuel gas, thereby resulting in being unable to activate the fuel cell. Furthermore, due to the condensation occurring in the reactant gas flow path and the resulting water freezing, the gas flow path could be blocked.

As a method for solving the above problem in the prior art, for example, JP laid-open patent publication No. 2005-71626 discloses, with regard to a fuel cell system used in a low-temperature environment, a technique of setting an output current to a maximum value upon activation in below-freezing conditions. This prior-art technique can facilitate self power generation in the fuel cell and shorten warm-up time.

Here, the above-mentioned JP laid-open patent publication No. 2005-71626 discloses, as a method for measuring the internal resistance of a fuel cell, measuring a high-frequency impedance (paragraphs 0076-0099). Since the internal resistance of a fuel cell has a strong relationship with the amount of water (hereinafter referred to as the "water content") left in the electrolyte membrane of the cell, the water content of the fuel cell can be estimated by measuring an AC impedance.

As a method of estimating such water content, for example, JP laid-open patent publication No. 2003-86220 discloses a fuel cell system that obtains the complex impedance of a fuel cell when a limiting wave signal is applied to an output signal of the fuel cell while changing the frequency from a high frequency to a low frequency, and estimates the fuel cell water condition from a resistance component R1, which increases when the internal water content of the fuel cell is insufficient, and a resistance component R2, which increases when the internal water content is too large. It is disclosed that the resistance component R1 is measured by applying a high-frequency sine-wave signal and the resistance component R2 is measured by applying a low-frequency sine-wave signal.

As a similar technique, JP laid-open patent publication No. 2003-297408 discloses a fuel cell system configured to detect the water content of a measurement gas by referring to either the voltage or current of an electrochemical cell.

Also, JP laid-open patent publication No. 2005-209635 discloses a fuel cell power production control method that detects the water left in both an electrolyte membrane and a reactant gas flow path to control the humidity of reactant gas, thereby optimizing the water left in the electrolyte membrane during the continuation of the fuel cell operation, and can consequently reduce or eliminate scavenging time when stopping the fuel cell and improve start-up performance when re-starting the fuel cell.

Furthermore, JP laid-open patent publication No. 2005-332702 discloses a fuel cell diagnostic apparatus that measures, by using a DC/DC converter for increasing/decreasing the voltage of a fuel cell with n cells or cell modules, the voltage change of each cell, etc., when an alternating current of a predetermined frequency is applied to the fuel cell, thereby measuring the internal resistance thereof, and detects an error of each cell, etc., from the above internal resistance and reactance.

Here, the invention disclosed in JP laid-open patent publication No. 2005-71626 is also an invention made in order to prevent loss or deterioration of carbon in the anode due to the oxidation of the carbon that would occur when the cell voltage of the fuel cell voltage goes below a specific voltage value, and in order to avoid such situation, an output current is set to a maximum value to the extent that the cell voltage of the fuel cell does not go below the specific voltage.

DISCLOSURE OF THE INVENTION

However, in the prior-art fuel cell systems described in the background art above, when measuring the impedance of a fuel cell (hereinafter also referred to as an "FC") based on an AC impedance method, voltage variation according to the applied AC signal also occurs in the output voltage of a battery device. If the minimum value in the above voltage variation is too small, a problem occurs in that there could be disadvantages for the cells that constitute the battery device.

The present invention has been made in light of the above problem in the prior art, and an object of the invention is to provide a fuel cell system that can protect a battery device when measuring the AC impedance of a fuel cell.

In order to solve the above problem, a fuel cell system according to the present invention has a fuel cell and a battery device connected such that the battery device can be charged with output power from the fuel cell, and is configured to be able to measure the AC impedance of the fuel cell, and in the fuel cell system, the AC impedance measurement is permitted when an output voltage value of the battery device falls within a predetermined range of protection voltage values with which the battery device can be protected.

Also, an AC impedance measurement method for a fuel cell system according to the present invention includes the steps of: superimposing a predetermined AC signal on an output voltage of the fuel cell; detecting an output voltage value of the battery device, the output voltage value varying as the fuel cell output voltage value on which the AC signal has been superimposed varies; comparing the detected battery device output voltage value with a predetermined threshold voltage; and determining whether the AC impedance measurement is permitted or not based on whether or not the battery device output voltage value exceeds the threshold voltage.

With the above configuration, the range of protection voltage values, which are output voltage values of the battery device with which the battery device can be protected, is determined in advance, and the AC impedance measurement is permitted only when the output voltage value of the battery device falls within the above range of protection voltages in accordance with the voltage variation due to the application of an AC signal necessary for the AC impedance measurement, and accordingly, it is possible to prevent the output voltage value from going down to a voltage value that could result in disadvantages for the battery device, and to ensure that the battery device is protected.

Here, the AC impedance measurement permission may be determined by detecting the battery device voltage variation when an AC signal is actually applied to the fuel cell output, and the AC impedance measurement permission may also be determined without actually applying an AC signal, but instead, by setting the range of protection voltage values in accordance with a preliminarily estimated range of variation of the battery device output voltage that would occur with the application of an AC signal.

If permission is determined by actually applying an AC signal, the above fuel cell system has: a voltage superimposing unit that superposes a predetermined AC signal on an output voltage of the fuel cell; a unit that detects an output voltage value of the battery device, the output voltage value varying as the fuel cell output voltage value on which the AC signal has been superimposed varies; a battery device voltage comparison unit that compares the detected battery device output voltage value with a predetermined threshold voltage; and a measurement permission determination unit that determines whether the AC impedance measurement is permitted or not based on whether or not the battery device output voltage value goes beyond the threshold voltage.

With the above configuration, the voltage superimposing unit applies an AC signal onto the output voltage of the fuel cell, the output voltage value detection unit detects the output voltage value of the battery device, the battery device voltage comparison unit compares the detected battery device output voltage value with a predetermined threshold voltage, and the measurement permission determination unit determines whether the AC impedance measurement is permitted or not based on whether or not the battery device output voltage value exceeds the threshold voltage. With these operations, it is possible to prevent the AC impedance measurement from continuing in a state where a momentary value of the battery device output voltage value goes below the threshold voltage due to the effect of the AC signal applied to the fuel cell output voltage.

Also, in the above fuel cell system, the AC impedance measurement is suspended for a predetermined period of time if the AC impedance measurement is determined as being not permitted.

With this configuration, the AC impedance measurement is interrupted for a while if the AC impedance measurement is not permitted. If an adequate time for the battery device output voltage to recover to the normal level is selected as the time of interruption, unnecessary processing for determining the AC impedance measurement permission can be avoided.

For example, it is preferable if the AC impedance measurement is determined as being not permitted if the battery device output voltage is equal to or less than a lower limit threshold voltage. With this configuration, a lower limit is established as the range of protection voltage values, and accordingly, disadvantages including destruction of a cell that would occur if the battery device output voltage value goes below this protection voltage value can be avoided.

Here, for example, it is preferable if the lower limit threshold voltage is set to be a voltage value obtained by adding a predetermined margin to a cell protection voltage value of the battery device. With this setting, whether or not the AC impedance measurement is permitted is determined by using the lower limit threshold value to which a margin is further added to the cell protection voltage value, and as a result, if a sufficient margin is set, it is possible to ensure that the battery device output voltage value is prevented from reaching the cell protection voltage value.

Furthermore, for example, the AC impedance measurement may be determined as being not permitted if the battery device output voltage value is equal to or higher than an upper limit threshold voltage. With this configuration, an upper limit is established as the range of protection voltage values, and accordingly, disadvantages including the application of an overvoltage that would occur if the battery device output voltage value goes over this protection voltage value can be avoided.

Here, for example, it is preferable if the upper limit threshold voltage is set to be a voltage value obtained by adding a predetermined margin to an overvoltage protection voltage value of the battery device. With this setting, whether or not the AC impedance measurement is permitted is determined by using the upper limit threshold to which a margin is further added to the overvoltage protection voltage value, and as a result, if a sufficient margin is set, it is possible to ensure that the battery device output voltage value is prevented from reaching the overvoltage protection voltage value.

BRIEF DESCRIPTION OF THE DRAWINGS

FIG. 5 is a diagram illustrating an output voltage or output power of a fuel cell and battery device, in which: FIG. 5(a) illustrates a fuel cell output voltage value $V_{FC}$ on which an AC signal (sine-wave voltage) is superimposed; FIG. 5(b) illustrates a fuel cell output power value $P_{FC}$ that varies due to the effect of the AC signal superimposed on the fuel cell output voltage value $V_{FC}$; FIG. 5(c) illustrates a battery device output power value $P_{BAT}$ in accordance with the variation of power passing through a voltage converter (DC/DC converter) along with the variation of the fuel cell output power value $P_{FC}$; and FIG. 5(d) illustrates a battery device output voltage value $V_{BAT}$ that varies due to the effect of the variation of the battery device output power value $P_{BAT}$.

BEST MODE FOR CARRYING OUT THE INVENTION

The most preferred embodiment of the fuel cell system according to the present invention will be described below in detail with reference to the drawings. In this embodiment, the fuel cell system is utilized in an electric vehicle that runs using a fuel cell as its power source (fuel cell vehicle).

Figure 1:
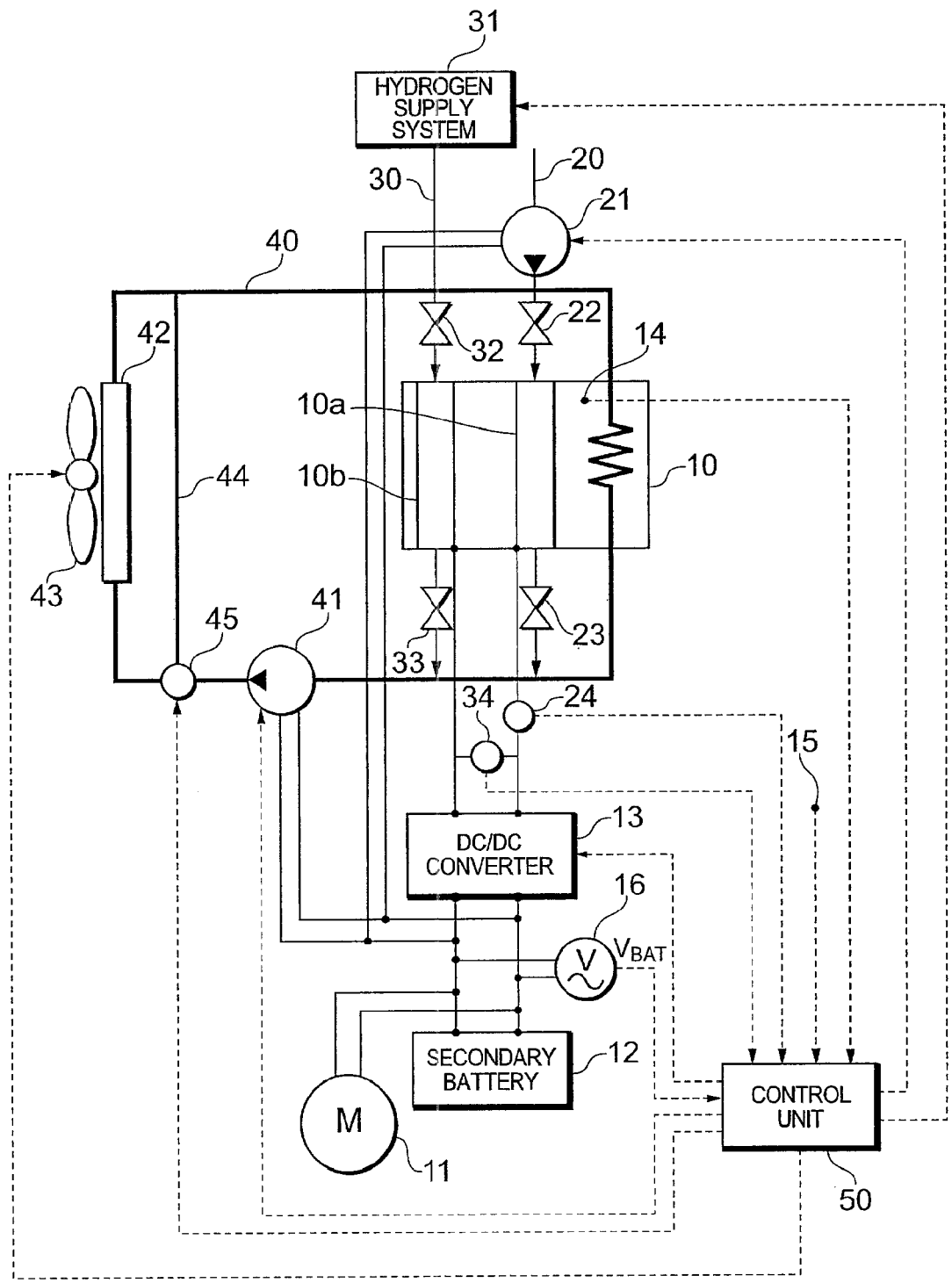
FIG. 1 is a diagram illustrating the configuration of the main parts of an electric vehicle equipped with a fuel cell system according to an embodiment of the present invention.

FIG. 1 is a diagram illustrating the configuration of the main parts of an electric vehicle equipped with a fuel cell system according to an embodiment of the present invention.

As illustrated in FIG. 1, the fuel cell system according to this embodiment has a fuel cell 10 that produces power through the electrochemical reaction between fuel gas (e.g., hydrogen gas) and oxidant gas (e.g., air that contains oxygen). In this embodiment, the fuel cell has a stack structure formed of a plurality of layered cells, each cell having a basic structure where a solid polymer electrolyte membrane is interposed between an oxygen electrode (positive electrode, cathode) 10a and a hydrogen electrode (negative electrode, anode) 10b. Hereinafter, this stack structure of the fuel cell is also referred to as an FC stack.

In the FC stack 10, electric energy produced by the following electrochemical reactions occurring in the oxygen electrode 10a side and the hydrogen electrode 10b side:

$2H^+ + 1/2O_2 + 2e^- \rightarrow H_2O$ (Oxygen electrode side)

$H_2 \rightarrow 2H^+ + 2e^-$ (Hydrogen electrode side)

The fuel cell system is provided with an air flow path 20 for supplying air to the oxygen electrode 10a side of the FC stack 10 and a hydrogen flow path 30 for supplying hydrogen to the hydrogen electrode 10b side of the FC stack 10.

The air flow path 20 is provided with an air pumping fan (compressor) 21 for supplying air. The air flow path 20 has shutoff valves 22 and 23 respectively at the air inlet and air outlet of the FC stack 10. The shutoff valves 22 and 23 are configured such that outside air can be blocked from flowing into the interior of the FC stack 10 and the interior of the air flow path 20 when these valves are closed.

The hydrogen flow path 30 is provided with a hydrogen supply unit 31 by which hydrogen is supplied. The hydrogen flow path 30 has shutoff valves 32 and 33 respectively at the hydrogen inlet and outlet of the FC stack 10. The shutoff valves 32 and 33 are configured such that hydrogen supply to the FC stack 10 can be blocked when these valves are closed.

The air flow path 20 and hydrogen flow path 30 are further provided with humidifiers not illustrated in the drawings. By the humidifiers, air in the air flow path 20 and hydrogen in the hydrogen flow path 30 are humidified, and humidified air and hydrogen are supplied to the FC stack 10. With this configuration, the FC stack 10 operates with its interior in a wet state. Also, on the oxygen electrode 10a side, water is produced by the above-described electrochemical reaction.

The FC stack 10 is also provided with a cooling system 40-45. The cooling system has a coolant flow path 40 for circulating a coolant (heat carrier) through the FC stack 10, a water pump 41 for circulating the coolant, and a radiator 42 with a fan 43. The radiator 42 and the fan 43 constitute a cooling unit. In the coolant flow path 40, a bypass 44 for allowing the coolant to bypass the radiator 42 is provided parallel to the radiator 42. The flow path of the coolant can be switched between the radiator 43 side and the bypass 44 side using a coolant switching valve 45.

The above cooling system is configured to be able to remove heat generated along with the power production by the fuel cell by controlling the cooling amount in the FC stack 10 through circulation flow rate control by the water pump 41, airflow rate control by the radiator 42 and the fan 43, and bypass flow rate control by the coolant switching valve 45, and to thereby control the operation temperature of the fuel cell to be a temperature suitable for the electrochemical reaction (around 80° C.).

This fuel cell system is further provided with a temperature sensor 14 for detecting the temperature of the FC stack itself and an outside air temperature sensor 15 that detects the outside air temperature.

Furthermore, the FC stack 10 is configured to supply power to electric devices, such as a vehicle driving electric motor (load) 11 and a secondary battery 12. A DC/DC converter (output current control unit) 13 for regulating the output voltage value of the FC stack 10 is provided between the FC stack 10 and the secondary battery 12.

The DC/DC converter 13 is configured to be able to arbitrarily change the primary-side (fuel cell-side) output voltage value, under the control of the control unit 50.

Figure 2:
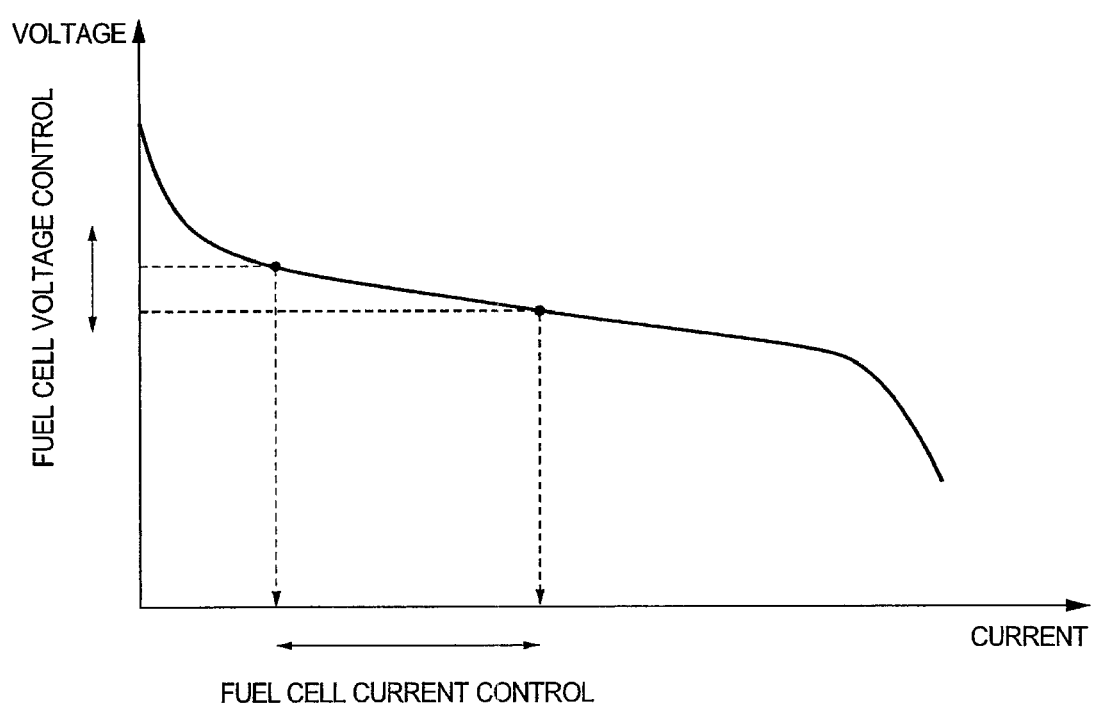
FIG. 2 is a graph illustrating the relationship between output voltage and output current of an FC stack 10 in a fuel cell system according to an embodiment of the present invention.

FIG. 2 is a graph illustrating the relationship between output voltage and output current of an FC stack 10 in a fuel cell system according to an embodiment of the present invention. As illustrated in FIG. 2, there is a correlation between output voltage and output current of the FC stack 10, and the FC stack 10 has the following characteristics: as the output current increases, the output voltage decreases, and as the output current decreases, the output voltage increases. Accordingly, the output current of the FC stack 10 is configured to be able to arbitrarily be controlled by controlling the output voltage of the FC stack 10 by the DC/DC converter 13 based on the control signals from the control unit 50.

Also, the DC/DC converter 13 is configured to be able to superimpose an AC signal on the primary-side (fuel cell-side) output based on the control signals from the control unit 50. This AC signal is used for AC impedance measurement. For example, the DC/DC converter 13 superimposes an AC signal on the primary side by applying AC voltage with a predetermined frequency to a control terminal of an active component that is provided such that it can modulate a power line. Voltage variation caused by the AC signal superimposed on the primary side also affects the secondary side of the DC/DC converter 13.

An electric current sensor 34 and voltage sensor 24 are connected to the primary side of the DC/DC converter 13 for AC impedance measurement. Also, a voltage sensor 16 that can detect an output voltage value of the secondary side is provided in the secondary side of the DC/DC converter 13. This voltage sensor 16 detects the variation of the output voltage value of the secondary battery 12 according to the present invention.

The fuel cell system of this embodiment is also provided with a control unit (ECU) 50 that performs various control functions. The control unit 50 receives, as inputs, a required power signal from the load 11, a temperature signal from the temperature sensor 14, an outside air temperature signal from the outside air temperature sensor 15, detection signals from the electric current sensor 24 and voltage sensor 34, and so on. The control unit 50 is also configured to output control signals to the secondary battery 12, DC/DC converter 13, fan 21, hydrogen supply unit 31, water pump 41, radiator fan 43, coolant switching valve 45, and so on. By outputting control signals to the DC/DC converter 13, the control unit 50 can superimpose an AC (sine-wave) signal on the secondary side of the DC/DC converter 13. Also, the control unit 50 can detect the variation of the output voltage value of the secondary side of the DC/DC converter 13 by receiving detection signals from the voltage sensor 16.

Figure 3:
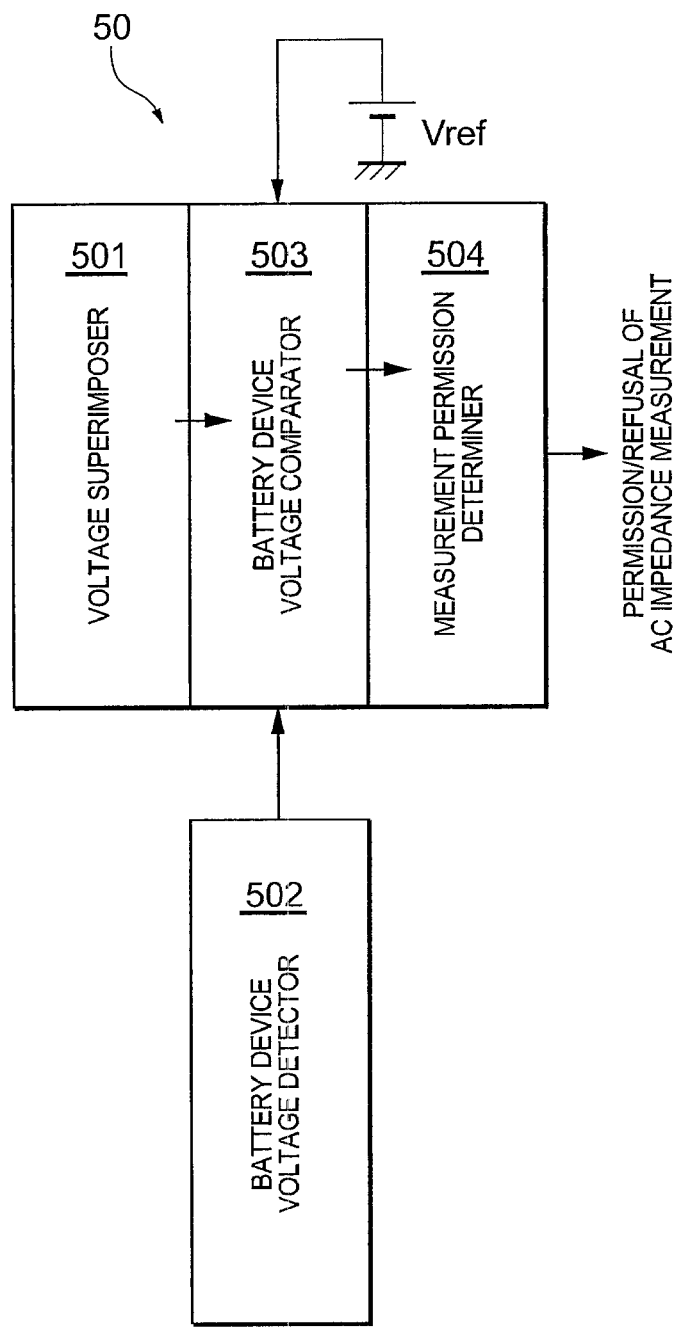
FIG. 3 is a block diagram illustrating main function blocks of a control unit 50 in a fuel cell system according an embodiment of the present invention.

FIG. 3 is a block diagram illustrating main function blocks of a control unit 50 in a fuel cell system according to an embodiment of the present invention.

As illustrated in FIG. 3, the control unit 50 has, as main function blocks, a voltage superimposer 501 (voltage superimposing unit), a battery device output voltage detector 502 (battery device output voltage detection unit), a battery device voltage comparator 503 (battery device voltage comparison unit) and a measurement permission determiner 504 (measurement permission determination unit).

The voltage superimposer 501 corresponds to the DC/DC converter 13 that applies an AC signal to a power line under the control of the control unit 50. The battery device output voltage detector 502 corresponds to the voltage sensor 16 that detects an output voltage value $V_{BAT}$ of the secondary battery 12 and supplies a detection signal to the control unit 50. The battery device voltage comparator 503 and the measurement permission determiner 504 correspond to the control unit 50 that preliminarily stores information regarding the range of protection voltage values for the secondary battery 12.

The voltage superimposer 501 superimposes an AC signal on the output voltage of the FC stack 10. The battery device output voltage detection part 502 detects the output voltage value of the secondary battery 12, which varies along with the variation of the output voltage value of the primary side of the DC/DC converter 13, on which an AC signal has been superimposed. The battery device voltage comparator 503 compares the detected output voltage value of the secondary battery 12 and a predetermined threshold voltage. The measurement permission determiner 504 determines whether the AC impedance measurement is permitted or not based on whether or not the output voltage value of the secondary battery 12 exceeds the threshold voltage.

More specifically, if a command to measure the impedance of the FC stack 10 is issued, for example, for the purpose of estimating the water content of the FC stack 10, the voltage superimposer 501 is activated and superimposes an AC signal, for example, a sine-wave signal with a predetermined frequency on the output voltage of the FC stack 10.

Since the output side of the FC stack 10 is connected to the output side of the secondary battery 12 via the DC/DC converter 13, the AC signal applied to the output voltage of the FC stack 10 affects the output voltage of the secondary battery 12, and the output voltage value of the secondary battery 12 also varies. The battery device output voltage detector 502 (voltage sensor 16) detects the above varying output voltage value $V_{BAT}$ of the secondary battery 12.

The battery device voltage comparator 503 compares the detected output voltage value of the secondary battery 12, for example, the minimum value (momentary value) of the output voltage value, with a preliminarily stored threshold voltage. The measurement permission determiner 504 determines whether the commanded impedance measurement of the FC stack 10 is permitted or not based on whether or not the output voltage value $V_{BAT}$ of the secondary battery 12 exceeds the threshold voltage.

If the impedance measurement of the FC stack 10 is determined as being permitted in the battery device voltage comparison part 503, the measurement permission determiner 504 sets, for example, a flag indicating that the AC impedance measurement is permitted. If the impedance measurement of the FC stack 10 is determined as being not permitted, the measurement permission determiner 504 sets, for example, a flag indicating that the AC impedance is not permitted. Then, the measurement permission determiner 504 suspends (interrupts) the impedance measurement for a predetermined period of time, and after the suspension period has passed, checks whether or not a command to cancel the impedance measurement has been issued. If a command to cancel the impedance measurement has not been issued, the impedance measurement is restarted. If a command to cancel the impedance measurement has been issued, the impedance measurement processing is finished.

Figure 4:
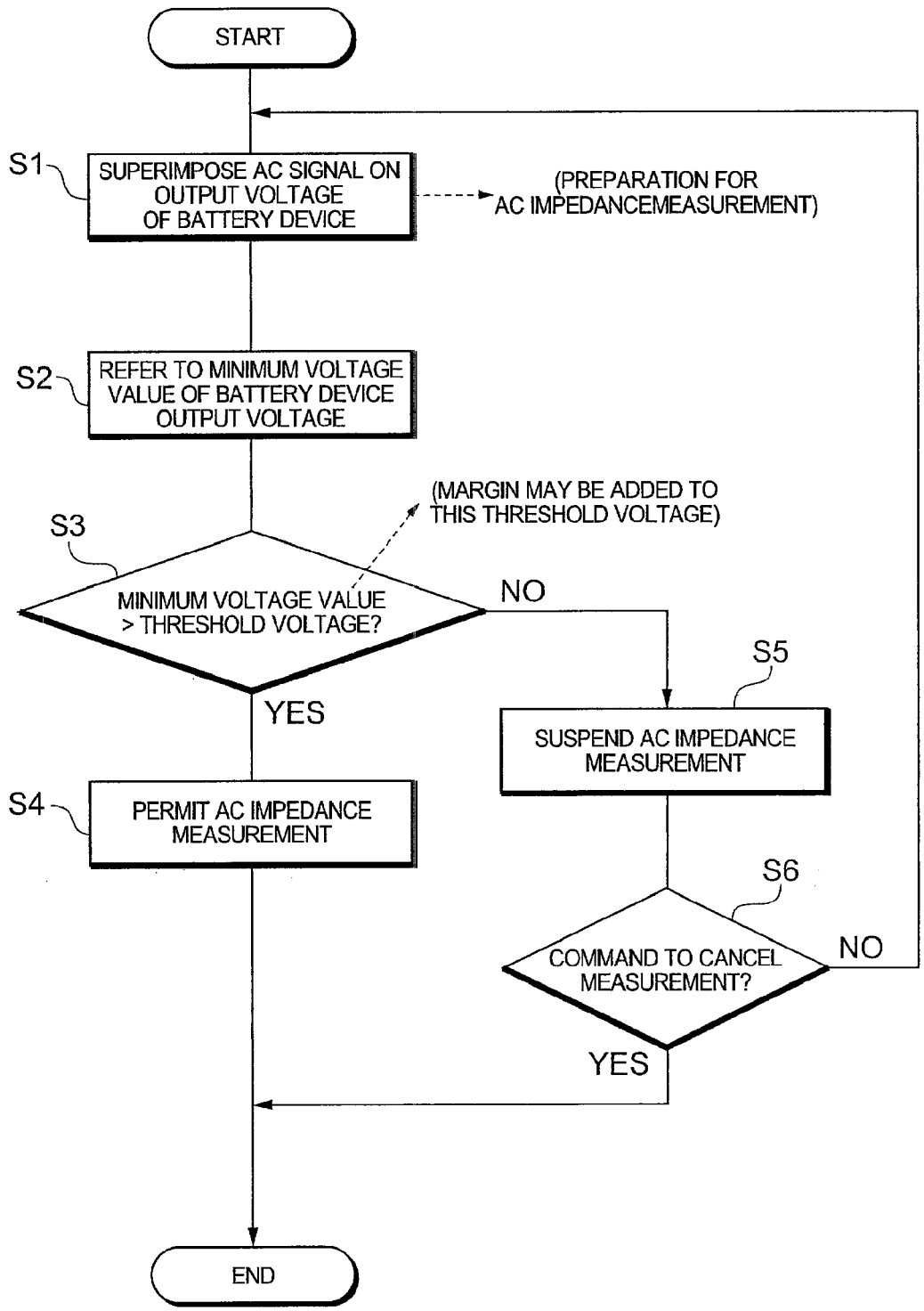
FIG. 4 is a flowchart illustrating control processes resulting in impedance measurement processing for an FC stack 10 in a fuel cell system according to an embodiment of the present invention.

FIG. 4 is a flowchart illustrating control processes resulting in impedance measurement processing for an FC stack 10 in a fuel cell system according an embodiment of the present invention.

Note that, in this flowchart, a command to measure the impedance of the FC stack 10 has already been issued to the control unit 50.

First, in step S1, the voltage superimposer 501 superimposes an AC signal with a predetermined frequency on the output voltage of the FC stack 10. More specifically, the control unit 50 supplies a control signal to the DC/DC converter 13, and the DC/DC converter 13 modulates the power line with an AC signal and superimposes the AC signal on the primary side thereof.

Next, in step S2, the battery device voltage detector 502, i.e., the voltage sensor 16 detects the output voltage value $V_{BAT}$ of the secondary battery 12. Among the detected output voltage values $V_{BAT}$ of the secondary battery 12, the battery device voltage comparator 503 particularly refers to the minimum value (momentary value).

Thereafter, in step S3, the battery device voltage comparator 503 determines whether or not the minimum value (momentary value) of the output voltage value of the secondary battery 12 is a voltage value higher than a predetermined threshold voltage Vref. The threshold voltage Vref is a lower limit threshold voltage obtained by adding a predetermined margin to a cell protection voltage for protecting an internal component, namely, a cell, of the secondary battery 12.

As a result of the above comparison, if the minimum value is a voltage value higher than the (lower limit) threshold voltage (YES), the processing goes to step S4, and the measurement permission determiner 504 determines that the output voltage value of the secondary battery 12 remains greater than the cell protection voltage value even if the AC signal is superimposed, and shifts to the control for permitting the AC impedance measurement.

On the other hand, if, as a result of the comparison, the minimum value is not a voltage value higher than the (lower limit) threshold voltage (NO), the processing goes to step S5, and the measurement permission determiner 504 determines that the output voltage value of the secondary battery 12 might go below the cell protection voltage value if the AC signal is superimposed, and shifts to the control for not permitting the AC impedance measurement.

More specifically, the processing goes to step S5, and the continuation of the impedance measurement is suspended for a predetermined period of time in order to protect the secondary battery 12, and then, the processing goes to step S6.

In step S6, the measurement permission determiner 504 checks whether or not a command to cancel the impedance measurement has been issued. If such a cancellation command has not been issued (NO), the processing goes back to step S1, and if such a cancellation command has been issued (YES), the processing ends.

Note that, in step S3 above, the output voltage value of the secondary battery is compared with the lower limit threshold value, and if it is determined as being equal to or lower than the lower limit threshold value, the AC impedance measurement is prohibited; however, in addition to the above process, a process may be added in which the output voltage value of the secondary battery is further compared with an upper limit threshold value, and if it is determined as being equal to or higher than the upper limit threshold value, the AC impedance measurement is prohibited (suspended). In the above case, the upper limit threshold value is preferably a voltage value obtained by adding a predetermined margin to an overvoltage protection voltage for protecting the secondary battery 12 from overvoltage.

Furthermore, whether or not a margin is added to the threshold value may be arbitrarily determined, and a margin may not be added as long as the secondary battery 12 can be protected.

Figure 5:
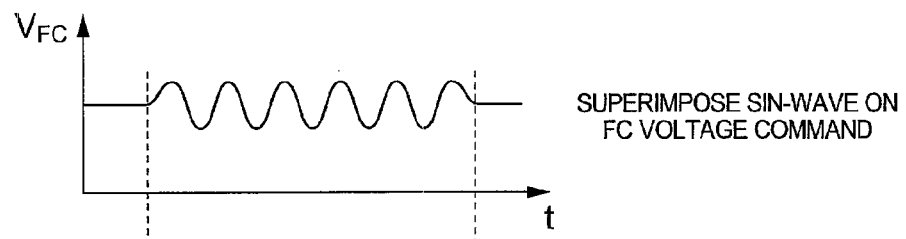
Figure 5:
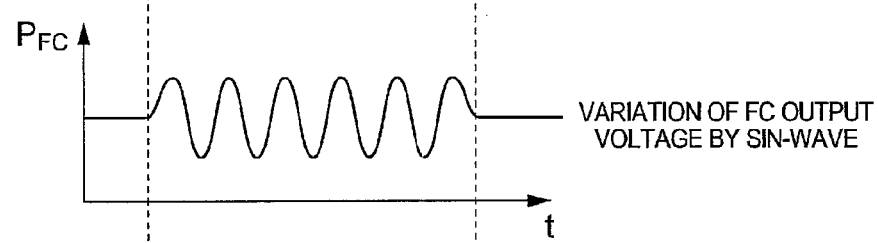
Figure 5:
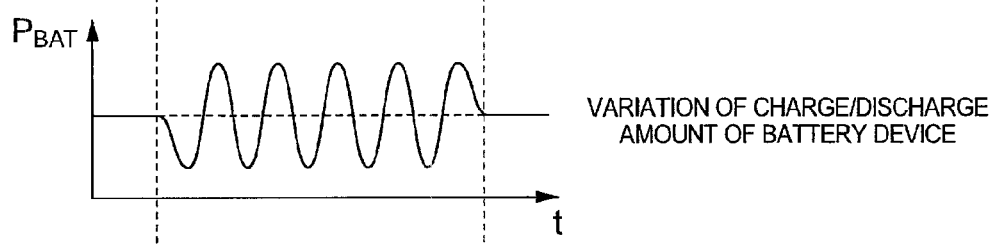
Figure 5:
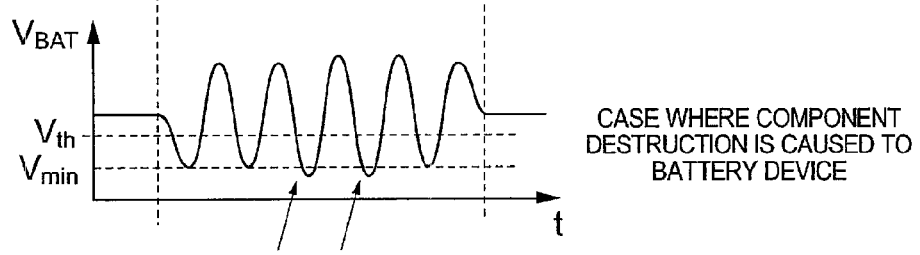

FIG. 5 is a graph for explaining the voltage variation occurring in the output voltage value of a battery device when a fuel cell is subjected to impedance measurement according to an AC impedance method.

FIG. 5(a) illustrates a fuel cell output voltage value $V_{FC}$ on which an AC signal (sine-wave) is superimposed. FIG. 5(b) illustrates a fuel cell output power value $P_{FC}$ that varies due to the effect of the AC signal superimposed on the fuel cell output voltage value $V_{FC}$. FIG. 5(c) illustrates a battery device output power value $P_{BAT}$ in accordance with the variation of power passing through a voltage converter (DC/DC converter) along with the variation of the fuel cell output power value $P_{FC}$. FIG. 5(d) illustrates a battery device output voltage value $V_{BAT}$ that varies due to the effect of the variation of the battery device output power value $P_{BAT}$.

In FIG. 5(d), Vmin indicates a destruction voltage at which the battery device (secondary battery) would be destroyed. This destruction voltage is a voltage equal to or lower than the above-mentioned cell protection voltage.

If the voltage variation as illustrated in FIG. 5(d) occurs in the output voltage of the battery device due to the superimposing of an AC signal on the fuel cell output, the minimum value of the output voltage value would go below the destruction voltage Vmin at the points indicated by the arrows, and the battery device could receive irreparable damage.

In this respect, according to the present invention, the (lower limit) threshold voltage is set to, for example, Vth as illustrated in FIG. 5(d), and the AC impedance measurement is prohibited and the application of an AC signal is interrupted if (the minimum value of) the battery device output voltage value goes below that threshold voltage.

As described above, according to this embodiment, the range of protection voltage values, which are output voltage values of the secondary battery with which the secondary battery can be protected, is determined in advance and set as a threshold value, and the AC impedance measurement is permitted only when the secondary battery output voltage value $V_{BAT}$ falls within the range of protection voltages in accordance with the voltage variation due to the application of an AC signal necessary for the AC impedance measurement. Accordingly, it is possible to prevent the output voltage value from going down to a voltage value Vmin that could result in disadvantages for the secondary battery, and to ensure that the secondary battery is protected.

According to this embodiment, the secondary battery output voltage value $V_{BAT}$ is detected and compared with the threshold voltage Vth, and the AC impedance measurement permission is determined based on whether or not the above output voltage value $V_{BAT}$ exceeds the threshold voltage Vth. Accordingly, it is possible to prevent the AC impedance measurement from continuing in a state where a momentary value of the battery device output voltage value $V_{BAT}$ goes below the threshold voltage Vth due to the effect of the AC signal applied to the fuel cell output voltage.

According to this embodiment, the AC impedance measurement is suspended for a predetermined period of time if the AC impedance measurement is determined as being not permitted. Accordingly, if an adequate time for the secondary battery output voltage to recover to the normal level is selected as the time of suspension, unnecessary processing for determining the AC impedance measurement permission can be avoided.

According to this embodiment, the lower limit threshold voltage value is set to a voltage value obtained by adding a predetermined margin to the cell protection voltage value for the secondary battery. Accordingly, if a sufficient margin is set, it is possible to ensure that the secondary battery output voltage value $V_{BAT}$ is prevented from reaching the cell protection voltage value or the destruction voltage Vmin.

Other Embodiments

The present invention is not limited to the above-described embodiment, and may be applied with modifications in various ways.

For example, in the above embodiment, the output voltage of the secondary battery 12 is configured to be compared and determined by the control unit 50, but the voltage sensor may be configured to determine whether or not the minimum value (momentary value) of the output voltage goes below a predetermined threshold voltage. In this case, the voltage sensor 16 is configured to transmit a signal to the control unit 50, only when the minimum value (momentary value) of the output voltage of the secondary battery 12 goes below the predetermined threshold voltage, the signal indicating such voltage drop below the threshold.

Furthermore, in the above embodiment, the secondary battery output voltage value is compared primarily with a lower limit threshold value, but as an alternative to or in addition to that comparison, the AC impedance measurement may be configured to be determined as being not permitted if the secondary battery output voltage value is equal to or higher than an upper limit threshold voltage. With this configuration, an upper limit is established as the range of protection voltage values, and accordingly, disadvantages including the application of an overvoltage that would occur if the battery device output voltage value goes over this protection voltage value can be avoided.

Furthermore, in the above embodiment, the determination is performed by detecting the voltage variation of the secondary battery when an AC signal is actually applied to the fuel cell output, but the way of determination is not limited to the above. For example, the range of protection voltage values may be established in accordance with a preliminarily estimated range of variation of the secondary battery output voltage that would occur along with the application of an AC signal to the fuel cell output. Some systems can make the amplitude of an AC signal applied to the fuel cell side constant, so the secondary-side voltage variation along with the superimposing of an AC signal on the primary side of the DC/DC converter can also be estimated in advance. Accordingly, taking the estimated secondary-side voltage variation into consideration, the protection range of the secondary battery output voltage value can be established in advance, and whether the AC impedance measurement is permitted or not for the protection of the secondary battery can be determined without actually applying an AC signal.

Furthermore, the fuel cell system of the present invention may be applied not only to vehicles but also to various mobile objects that travel on land, underground, on the sea, in the sea, in the air, and in space. Obviously, the present invention may be applied to fixed fuel cell systems.

INDUSTRIAL APPLICABILITY

According to the present invention, the range of protection voltage values, which are output voltage values of the battery device with which the battery device can be protected, is determined in advance, and the AC impedance measurement is permitted only when the output voltage value of the battery device falls within the above range of protection voltage values in accordance with the voltage variation due to the application of an AC signal necessary for the AC impedance measurement, and accordingly, it is possible to prevent the output voltage value from going down to a voltage value that could result in disadvantages for the battery device, and to ensure that the battery device is protected.

The present invention can be applied when constructing a fuel cell system having a fuel cell that produces electric energy through the chemical reaction between fuel gas (e.g., hydrogen) and oxidant gas (e.g., air), and in particular, the present invention is suitable for use in a fuel cell system in which impedance measurement is performed according to an AC impedance method.

The invention claimed is:

1. A fuel cell system which comprises a fuel cell and a battery device connected such that the battery device can be charged with output power from the fuel cell, the fuel cell system being configured to be able to measure an AC impedance of the fuel cell, the fuel cell system comprising:
a voltage superimposing unit that superimposes a predetermined AC signal on an output voltage of the fuel cell;
a unit that detects an output voltage value of the battery device, the output voltage value varying as the fuel cell output voltage value on which the AC signal has been superimposed varies;
a battery device voltage comparison unit that compares the detected battery device output voltage value with a predetermined threshold voltage; and
a measurement permission determination unit that determines whether the AC impedance measurement is permitted or not based on whether or not the battery device output voltage value exceeds the threshold voltage,
wherein the AC impedance measurement is determined as being not permitted if the battery device output voltage value is equal to or lower than a lower limit threshold voltage,
wherein the lower limit threshold voltage is set to be a voltage value obtained by adding a predetermined margin to a cell protection voltage value of the battery device.

2. The fuel cell system according to claim 1, wherein the AC impedance measurement is suspended for a predetermined period of time if the AC impedance measurement is determined as being not permitted.

3. The fuel cell system according to claim 1, wherein the AC impedance measurement is also determined as being not permitted if the battery device output voltage value is equal to or higher than an upper limit threshold voltage.

4. The fuel cell system according to claim 3, wherein the upper limit threshold voltage is set to be a voltage value obtained by adding a predetermined margin to an overvoltage protection voltage value of the battery device.

5. An AC impedance measurement method for a fuel cell system provided with a fuel cell and a battery device connected such that the battery device can be charged with output power from the fuel cell, the method comprising:
superimposing a predetermined AC signal on an output voltage of the fuel cell;
detecting an output voltage value of the battery device, the output voltage value varying as the fuel cell output voltage value on which the AC signal has been superimposed varies;
comparing the detected battery device output voltage value with a predetermined threshold voltage; and
determining whether the AC impedance measurement is permitted or not based on whether or not the battery device output voltage value exceeds the threshold voltage,
wherein the AC impedance measurement is determined as being not permitted if the battery device output voltage value is equal to or lower than a lower limit threshold voltage,
wherein the lower limit threshold voltage is set to be a voltage value obtained by adding a predetermined margin to a cell protection voltage value of the battery device.

* * * * *